(12) United States Patent
Chiu et al.

(10) Patent No.: US 7,809,543 B2
(45) Date of Patent: Oct. 5, 2010

(54) METHOD, APPARATUS AND COMPUTER PROGRAM PRODUCT FOR ELECTRICAL PACKAGE MODELING

(75) Inventors: Charles Chiu, Essex Junction, VT (US); Craig Lussier, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 11/621,184

(22) Filed: Jan. 9, 2007

(65) Prior Publication Data
US 2008/0168409 A1 Jul. 10, 2008

(51) Int. Cl.
*G06F 17/50* (2006.01)
*G06F 9/45* (2006.01)

(52) U.S. Cl. ............................................ 703/15; 716/5

(58) Field of Classification Search ................. 703/13, 703/14, 15; 716/1, 4, 5, 10, 18–20
See application file for complete search history.

(56) References Cited

U.S. PATENT DOCUMENTS

| | | | |
|---|---|---|---|
| 6,526,555 B1* | 2/2003 | Teig et al. | 716/11 |
| 2001/0034587 A1* | 10/2001 | Anderson et al. | 703/2 |
| 2005/0114806 A1* | 5/2005 | Gasparik et al. | 716/5 |
| 2006/0123374 A1* | 6/2006 | Douriet | 716/10 |

OTHER PUBLICATIONS

Na et al. The effects of on-chip and package decoupling capacitors and and efficient ASIC decoupling methodology, 2004, IEEE proceedings of 54th electronic components and technology conference, vol. 1, 556-567.*

Brain W. Amick, Claude R. Gauthier, Dean Liu, "Macro-Modeling Concepts for the Chip Electrical Interface", ACM 1-58113-461-4/02/0006, Jun. 10-14, 2002, pp. 391-393.*

* cited by examiner

*Primary Examiner*—Dwin M Craig
(74) *Attorney, Agent, or Firm*—David Cain; Roberts Mlotkowski Safran & Cole, P.C.

(57) ABSTRACT

A method, apparatus, and computer program product for creating a model representing an electrical network residing in an integrated circuit package.

14 Claims, 12 Drawing Sheets

METHOD, APPARATUS AND COMPUTER PROGRAM PRODUCT FOR ELECTRICAL PACKAGE MODELING

BACKGROUND

1. Technical Field of the Present Invention

The present invention generally relates to integrated circuits and, more specifically, to the design and modeling of the packaging used for the integrated circuit.

2. Description of Related Art

The insatiable appetite of the consumer for electronic devices that are increasingly smaller, faster, and contain more functionality than previous models has fueled the evolution of the electronic industry. Each one of these electronic devices contains one or more integrated circuit chips that range in complexity from a system on a chip to one or more dedicated processors.

This fast paced demand has challenged the semiconductor industry to decrease the amount of time that it takes to proceed from the design to production stage. Various simulation tools are used in this process to simulate different aspects of the integrated circuit and to create models that are representative of the behavior of the final product. These models have become an integral and indispensable part of the semiconductor design and verification process.

One such model is the integrated circuit electrical package model that represents the various electrical networks residing in the electronic package itself. Unfortunately, current models are inefficient for simulating power supply noise for integrated circuits and the simulation time is considerable.

It would, therefore, be a distinct advantage to have an electrical package model optimized for size so that shorter simulation times can be accomplished.

SUMMARY OF THE PRESENT INVENTION

In one aspect, the present invention is a method of creating a model for representing an electrical network residing in an integrated circuit package having multiple layers. The method includes the step of creating both lateral and horizontal representations of the electrical network for each layer of the integrated circuit package, the lateral representations each being coupled to another lateral or horizontal representation. The method also includes the steps of selecting one of the layers, and removing the lateral representations on the selected layer that are not coupled to one or more horizontal representations.

BRIEF DESCRIPTION OF THE DRAWINGS

The present invention will be better understood and its advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

The present invention is a method, apparatus, and computer program product for creating a compact model that is representative of one or more electrical networks residing in an integrated circuit package.

Figure 1:
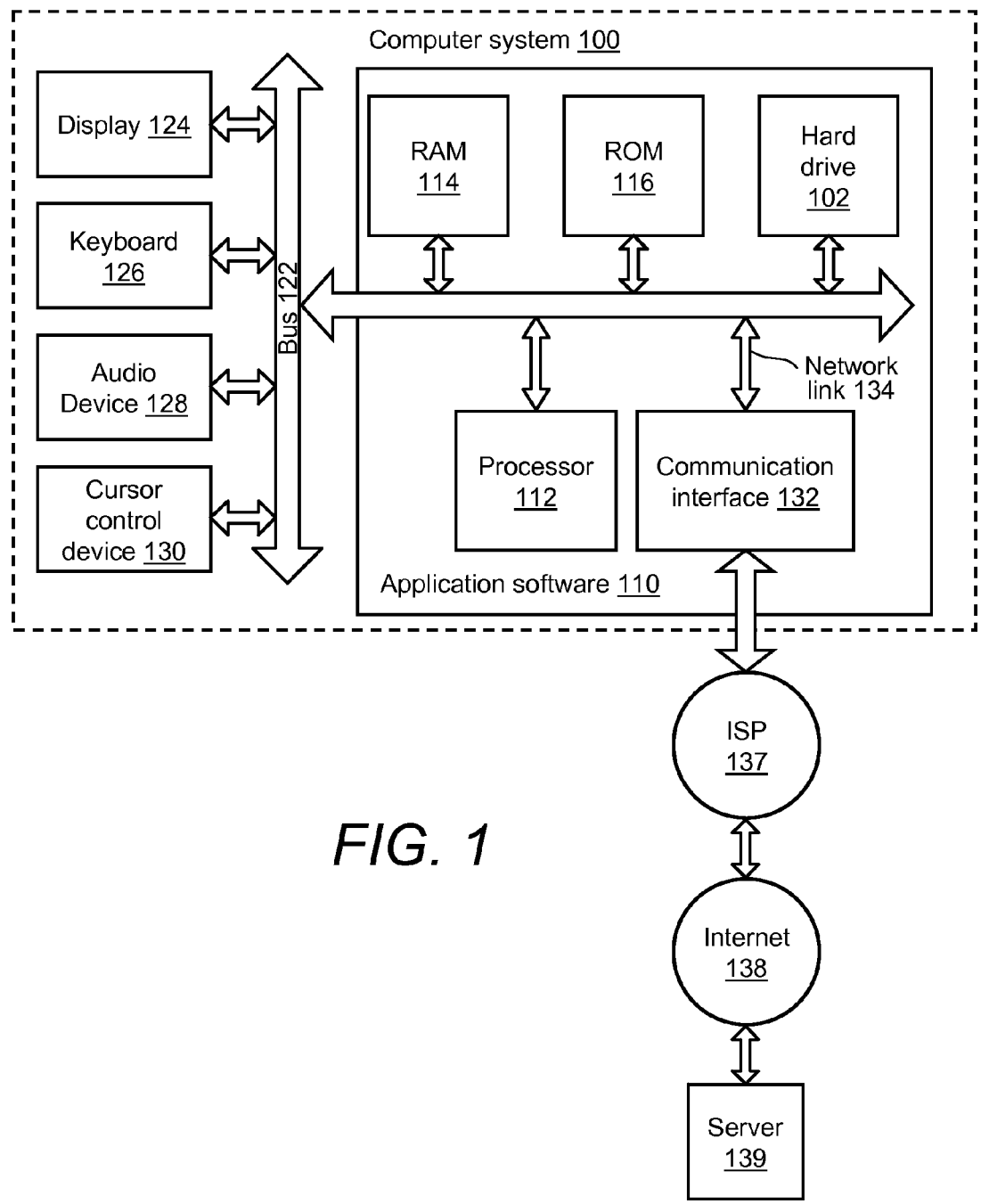
FIG. 1 is a block diagram illustrating a computer system that can be used to implement a preferred embodiment of the present invention.

Reference now being made to FIG. 1, a block diagram is shown illustrating a computer system 100 that can implement an embodiment of the present invention. Computer System 100 includes various components each of which is explained in greater detail below.

Bus 122 represents any type of device capable of providing communication of information within Computer System 100 (e.g., System bus, PCI bus, cross-bar switch, etc.)

Processor 112 can be a general-purpose processor (e.g., the PowerPC™ manufactured by IBM or the Pentium™ manufactured by Intel) that, during normal operation, processes data under the control of an operating system and application software 110 stored in a dynamic storage device such as Random Access Memory (RAM) 114 and a static storage device such as Read Only Memory (ROM) 116. The operating system preferably provides a graphical user interface (GUI) to the user.

The present invention, including the alternative preferred embodiments, can be provided as a computer program product, included on a machine-readable medium having stored on it machine executable instructions used to program computer system 100 to perform a process according to the teachings of the present invention.

The term "machine-readable medium" as used in the specification includes any medium that participates in providing instructions to processor 112 or other components of computer system 100 for execution. Such a medium can take many forms including, but not limited to, volatile and non-volatile media.

Common forms of non-volatile media include, for example, a floppy disk, a flexible disk, a hard disk, magnetic tape, or any other magnetic medium, a Compact Disk ROM (CD-ROM), a Digital Video Disk-ROM (DVD-ROM) or any other optical medium whether static or re-writeable (e.g., CDRW and DVD RW), punch cards or any other physical medium with patterns of holes, a programmable ROM (PROM), an erasable PROM (EPROM), electrically EPROM (EEPROM), a flash memory, any other memory chip or cartridge, or any other medium from which computer system 100 can read and which is suitable for storing instructions. In the preferred embodiment, an example of a non-volatile medium is the Hard Drive 102.

Volatile media includes dynamic memory such as RAM 114. Transmission media includes coaxial cables, copper wire or fiber optics, including the wires that comprise the bus 122. Transmission media can also take the form of acoustic or light waves, such as those generated during radio wave or infrared data communications.

Moreover, the present invention can be downloaded as a computer program product where the program instructions can be transferred from a remote computer such as server 139 to requesting computer system 100 by way of data signals embodied in a carrier wave or other propagation medium via network link 134 (e.g., a modem or network connection) to a communications interface 132 coupled to bus 122.

Communications interface 132 provides a two-way data communications coupling to network link 134 that can be connected, for example, to a Local Area Network (LAN), Wide Area Network (WAN), or as shown, directly to an Internet Service Provider (ISP) 137. In particular, network link 134 may provide wired and/or wireless network communications to one or more networks.

ISP 137 in turn provides data communication services through the Internet 138 or other network. Internet 138 may refer to the worldwide collection of networks and gateways that use a particular protocol, such as Transmission Control Protocol (TCP) and Internet Protocol (IP), to communicate with one another. ISP 137 and Internet 138 both use electrical, electromagnetic, or optical signals that carry digital or analog data streams. The signals through the various networks and the signals on network link 134 and through communication interface 132, which carry the digital or analog data to and from computer system 100, are exemplary forms of carrier waves transporting the information.

In addition, multiple peripheral components can be added to computer system 100. For example, audio device 128 is attached to bus 122 for controlling audio output. A display 124 is also attached to bus 122 for providing visual, tactile or other graphical representation formats. Display 124 can include both non-transparent surfaces, such as monitors, and transparent surfaces, such as headset sunglasses or vehicle windshield displays.

A keyboard 126 and cursor control device 130, such as mouse, trackball, or cursor direction keys, are coupled to bus 122 as interfaces for user inputs to computer system 100.

The application software 110 can be an operating system or any level of software capable of executing on computer system 100 and is preferably used to create and/or modify an electronic package model as explained below.

Figure 2:
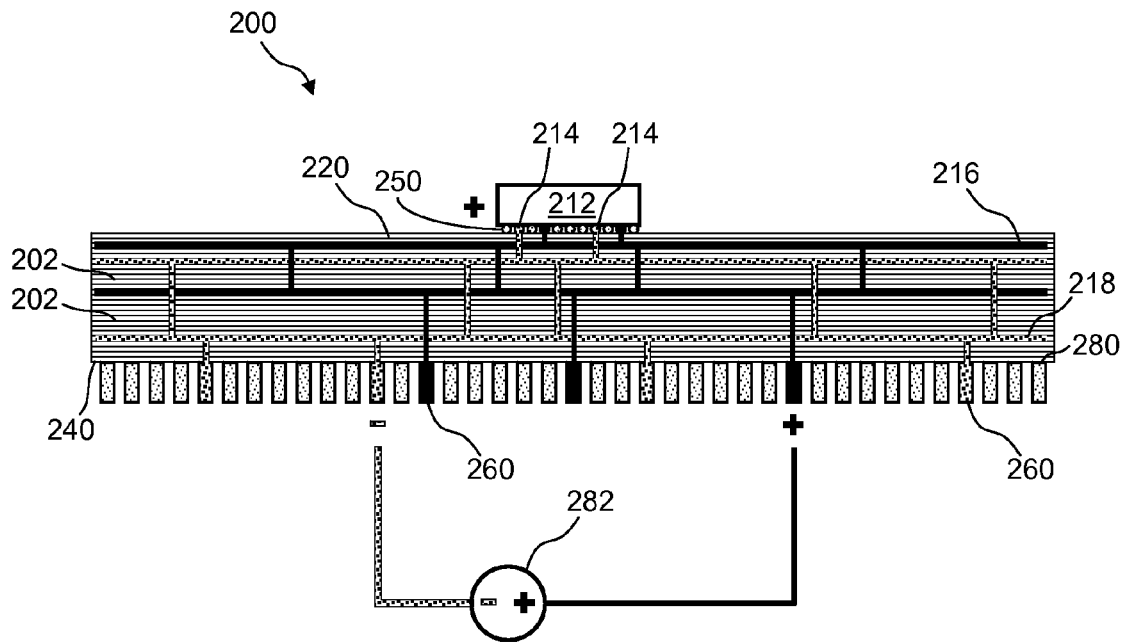
FIG. 2 is a diagram illustrating a cross sectional view of an electronic package coupled to an integrated circuit.

Reference now being made to FIG. 2, a diagram is shown illustrating a cross sectional view of an electronic package 200 coupled to an integrated circuit 212. The electronic package 200 includes a multitude of layers (planes) 202 each having various electrical components and pathways. The top layer (surface) 220 and bottom layer (surface) 240 each include ports (250 and 280, respectively) and interconnections (214 and 260, respectively) for providing power and access to various functions of the electronic device 212.

Interconnections 260 can be, for example, solder columns, a ball grid array, a land grid array, or other means for connecting to the integrated circuit 212. Similarly, interconnections 214 can be, for example, solder bumps such as controlled collapse chip connection (C4) solder balls for connecting to the integrated circuit 212.

Electronic package 200 also includes one or more power and ground electrical networks (e.g., VDD 216 and GND 218) that supply electrical current to the electronic device 212 using an internal or external power source (such as battery 282).

Electronic package 200 has been used as a convenient means in which to explain the present invention and is not intended to be considered a limitation on the many different types and configurations of other electronic packages and their designs to which the present invention is applicable.

The present invention creates a model for each one of the electrical networks (e.g., VDD 216 and GND 218) as explained in connection with FIG. 3 below.

Figure 3:
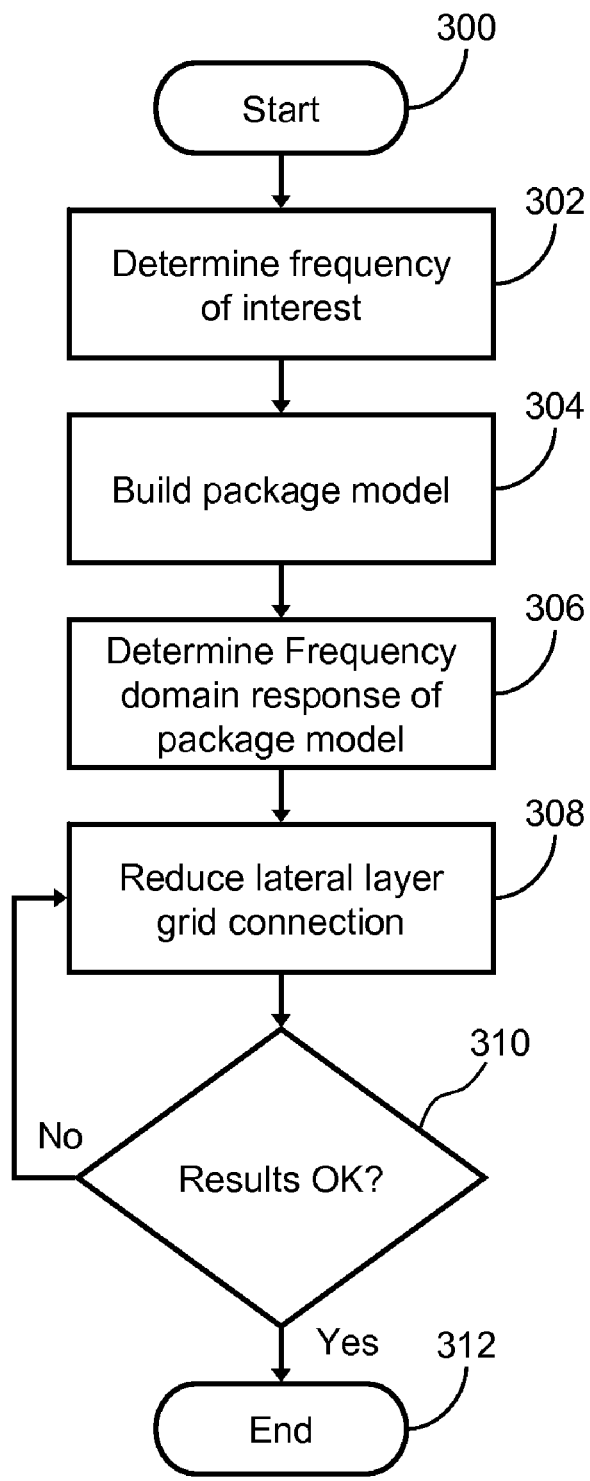
FIG. 3 is a flow chart illustrating a method for creating a model of an electrical network residing within an electronic package according to the teachings of the present invention.

Reference now being made to FIG. 3, a flow chart is shown illustrating the method for creating a model of an electrical network residing within an electronic package according to the teachings of the present invention. The method for creating a model of an electrical network (e.g., VDD 216 (FIG. 2)) begins by determining the frequency of interest (Steps 300-302).

The frequency of interest can be found by examining the profiles of the switching current spectrum for the integrated circuit (e.g., 212). Circuits that have the fastest rise time produce a current spectrum with amplitudes at the highest frequency. Consequently, the frequency of interest can be determined by analyzing currents from circuits having a fast rise time and large transient currents.

The time domain current is obtained by using simulation software such as Spice with the actual circuits and an inductance that is representative of the electronic package to create a realistic waveform. The time domain waveforms of these circuits are then analyzed by using a discreet Fourier transform algorithm such as Fast Fourier Transform to create a spectrum in frequency domain. The range where significant amplitudes exist is defined as the frequency range of interest. An inverter is used as a convenient example to illustrate how the frequency range of interest is defined in connection with FIGS. 4 and 5 below.

Figure 4:
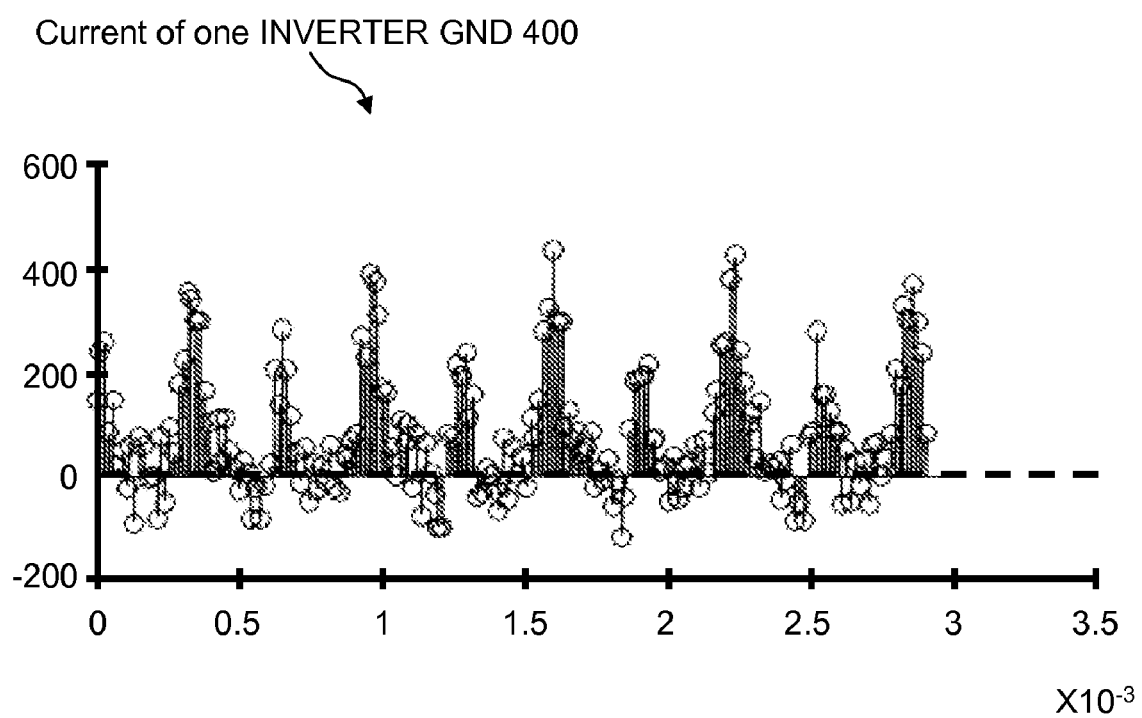
FIG. 4 is a diagram illustrating a time domain current waveform that is generated from a typical inverter (not shown) using simulation software such as Spice.
Figure 5:
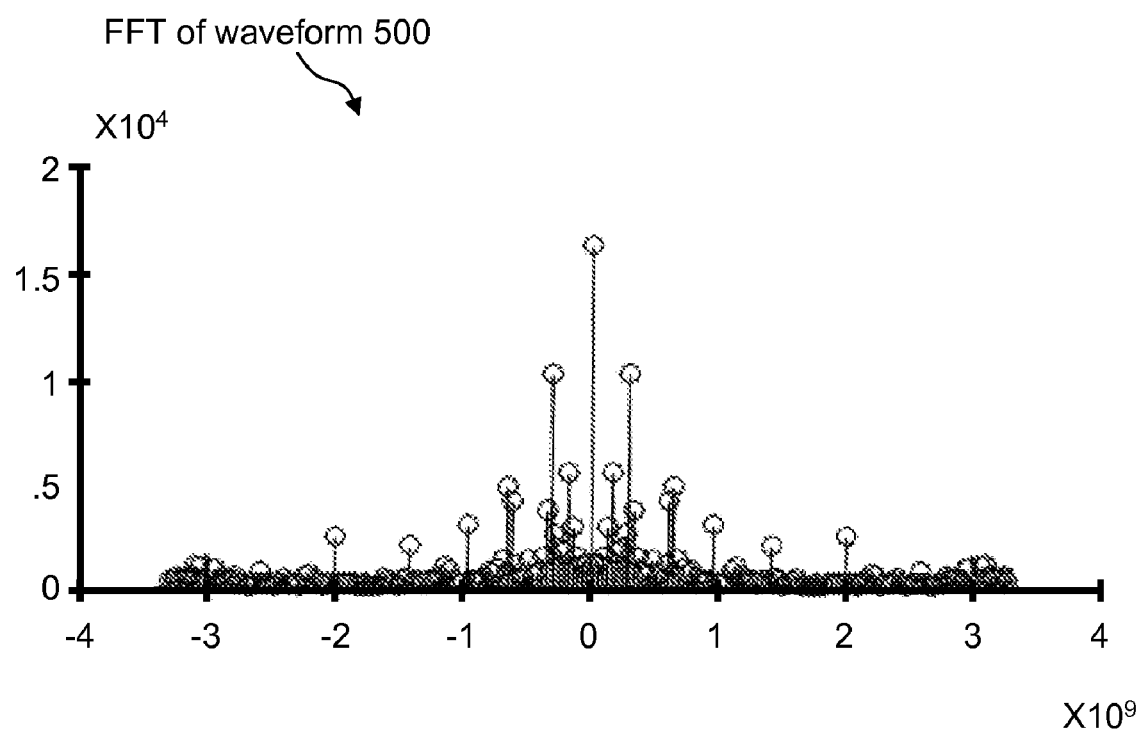
FIG. 5 is a diagram illustrating a FFT waveform generated using Fast Fourier Transform on the time domain current waveform of FIG. 4 according to the teachings of the present invention.

Reference now being made to FIG. 4, a diagram is shown illustrating the time domain current waveform 400 that is generated from a typical inverter (not shown) using simulation software such as Spice. The x-axis represents time and the y-axis current in micro-amps. The generated time domain for the inverter is transformed using Fast Fourier Transform to create the FFT waveform 500 illustrated by FIG. 5. The x-axis represents frequency and the y-axis represents amplitude. As illustrated, the frequency range of interest for the inverter is from DC to 2 GHz.

Referring again to FIG. 3, the method continues by constructing a model of the electrical network of the electronic package (e.g., electronic package 200 (Step 304)). The electronic package 200 of FIG. 2 is used as an example for constructing this model as explained in connection with FIG. 6 below.

Figure 6:
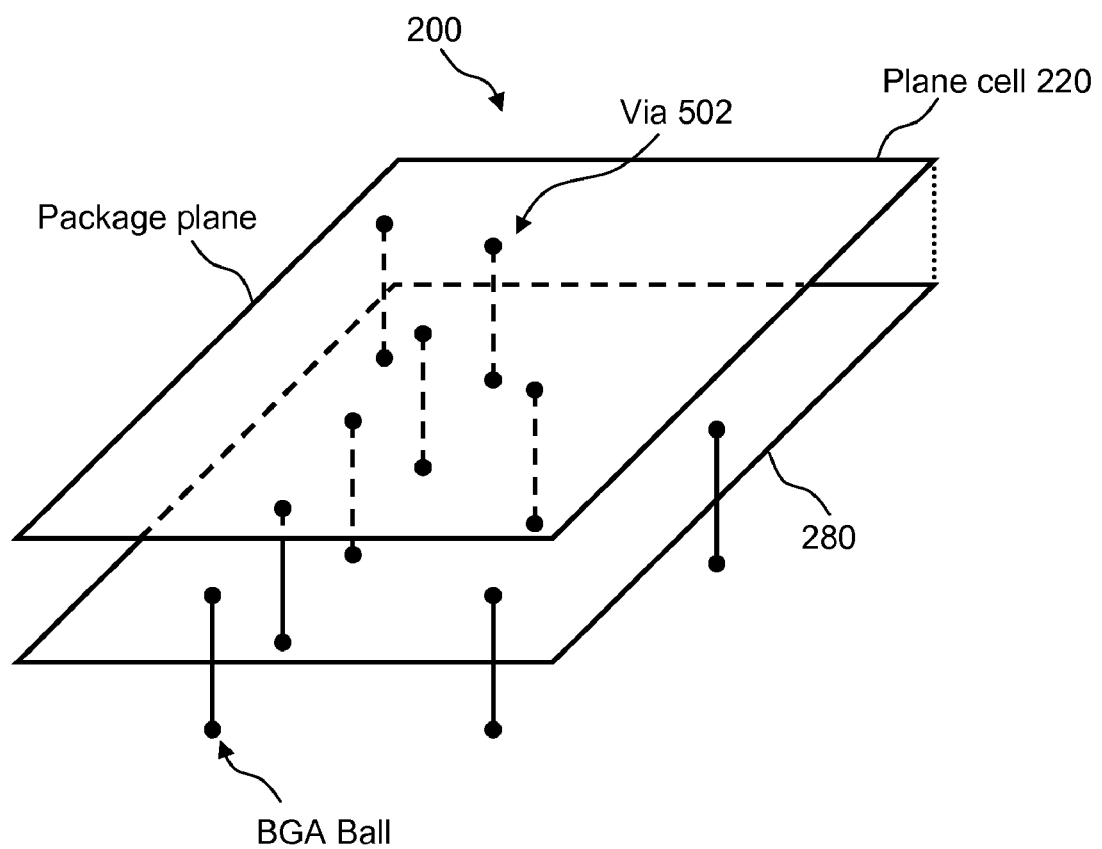
FIG. 6 is a diagram illustrating how an electrical network (e.g., VDD) of the electronic package of FIG. 2 can be viewed and modeled according to the teachings of the present invention.

Reference now being made to FIG. 6, a diagram is shown illustrating how an electrical network (e.g., VDD 216) of the electronic package of 200 can be viewed and modeled according to the teachings of the present invention. Each one of the layers 202 includes one or more vias 502 distributed in the layer 202 for providing access to the next or prior layer (if any). An electrical network of the package 200 can be modeled by dividing each one of these layers 202 into cells or grids in the x and y axis as illustrated by FIG. 7.

Figure 7:
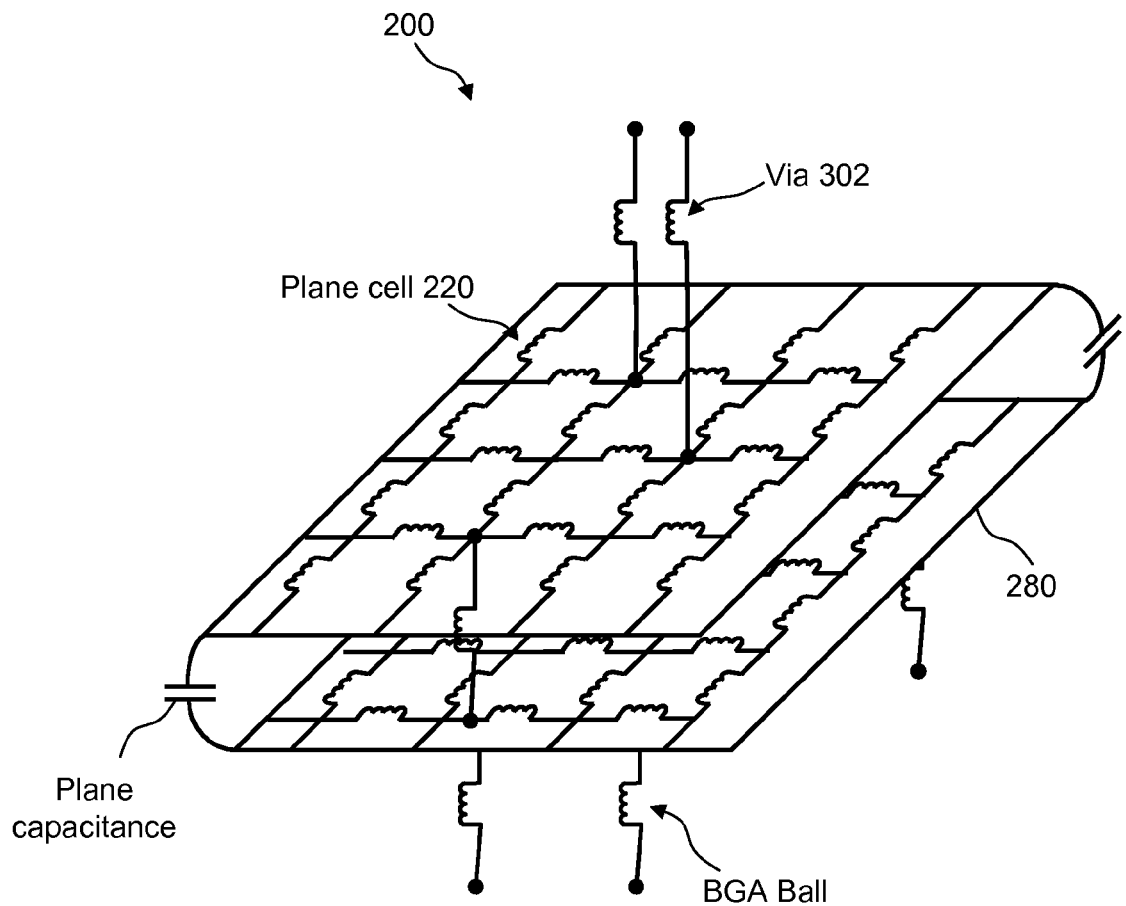
FIG. 7 is a diagram illustrating a method for modeling the electronic package of FIG. 6 according to the teachings of the present invention.

Reference now being made to FIG. 7, a diagram is shown illustrating a method for modeling the electronic package 200 of FIG. 6 according to the teachings of the present invention. The modeling of an electrical network residing within the electronic package 200 begins by dividing each layer in the x and y axis so as to create a cell or grid structure for each layer. All vias residing within a particular cell are combined and represented by a single inductor in series with a resistor (for simplicity, only a single inductor is shown in FIG. 7) extending from the cell to the next or prior layer 202.

The metal portion of each layer 202 is modeled as an inductor in series with a resistor and coupled to the edge of the cell. Each of the package balls or interconnections 260 (FIG. 2) is treated in the same fashion as vias (i.e., if they reside in a single cell, then any vias including the package balls within that cell are represented by a single inductor in series with a resistor coupled to the cell and extending to the next layer 202).

Figure 8:
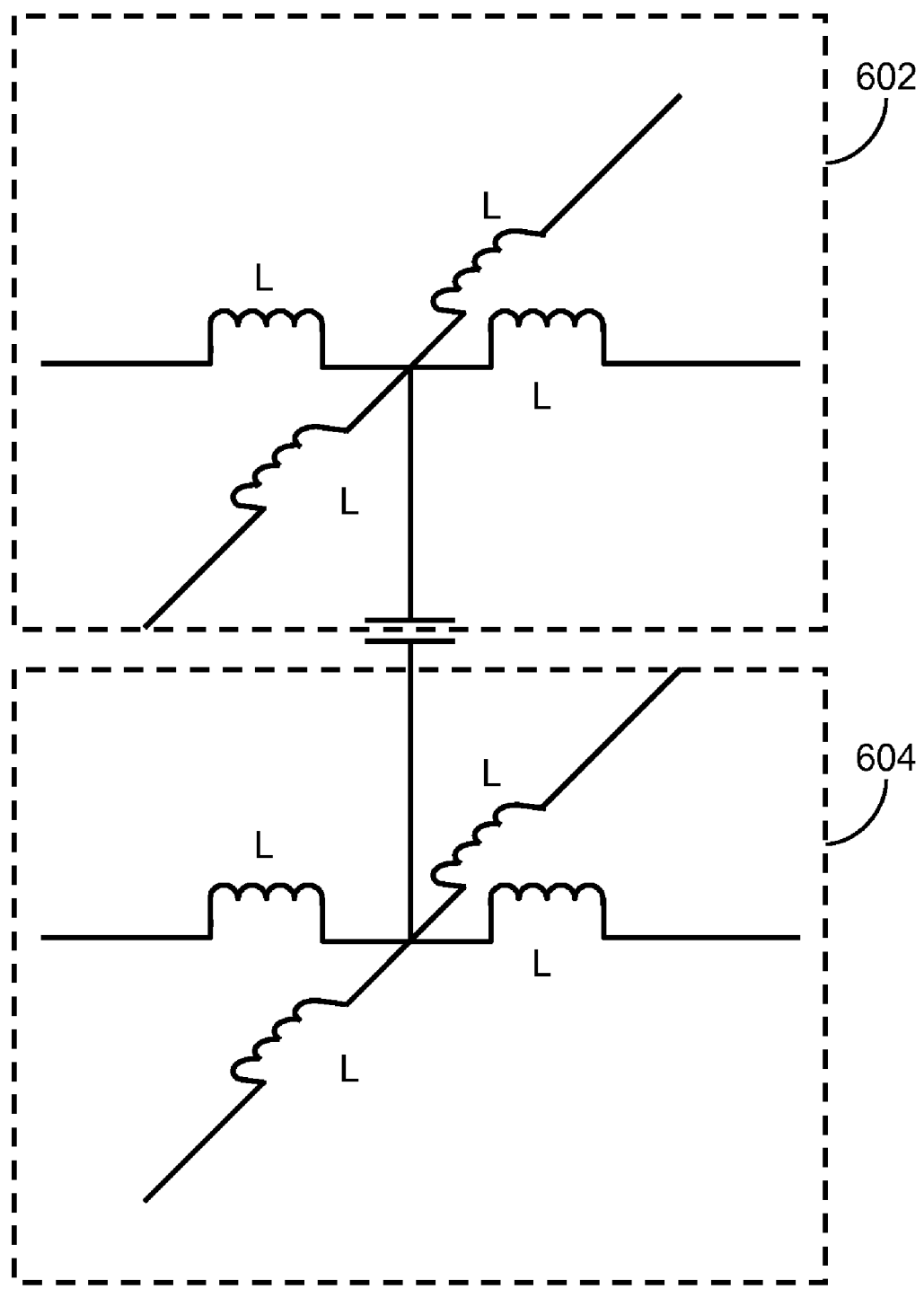
FIG. 8 is a diagram illustrating the capacitance between layers in the electrical package of FIG. 7 according to the teachings of the present invention.

Capacitance between layers 202 is represented in the electrical model as a capacitor C coupled between adjacent cells 602 and 604 of two corresponding layers 202 of FIG. 7 as illustrated in FIG. 8.

Referring again to FIG. 3, the method continues by determining the frequency domain response of the constructed package model (Step 306). A software simulation tool such as Spice can be used to construct an impedance plot for the electrical network (e.g., VDD 216 or GND 218). The capacitance between planes 202 is relatively small so it is ignored in the model.

The method continues by reducing the lateral layer grid connections from the electronic package model (Step 308) as explained in connection with FIG. 9 below.

Figure 9:
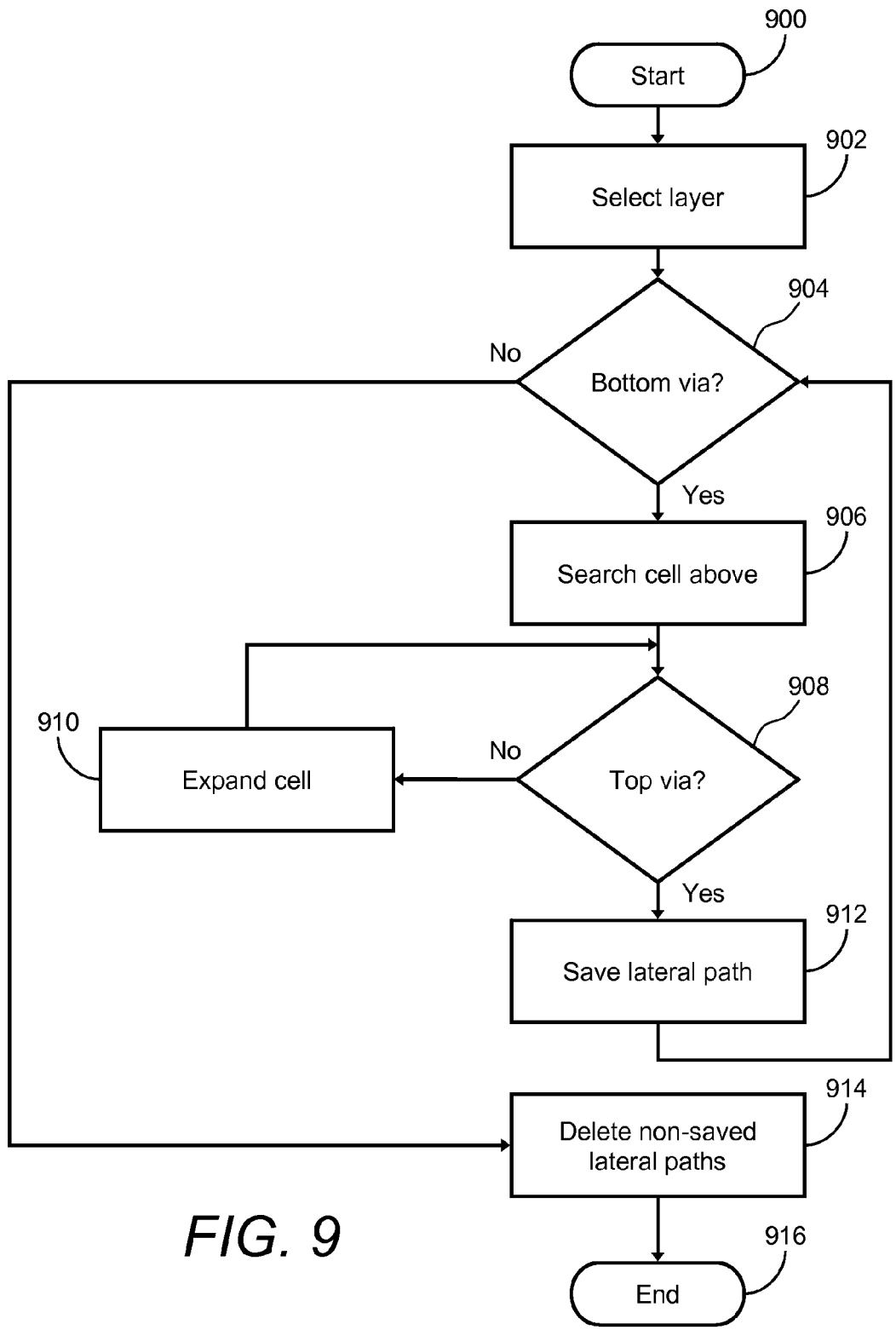
FIG. 9 is a flow chart illustrating in greater detail the method of reducing lateral connections on a selected layer of the electronic package model of FIG. 7 according to the teachings of the present invention.

Reference now being made to FIG. 9, a flow chart is shown illustrating in greater detail the method of reducing lateral connections on a selected layer of the electronic package model of FIG. 7 according to the teachings of the present invention. The reduction begins by selecting one of the layers of the electronic package model 200 for lateral reduction (Steps 900-902). In the preferred embodiment of the present invention, the last layer (e.g., 280 of FIG. 2) is initially selected for lateral reduction, and if further reductions are required, then each prior layer is selected until the desired results are achieved. The reduction of the lateral connections is explained in connection with the example of FIG. 10 below.

Figure 10:
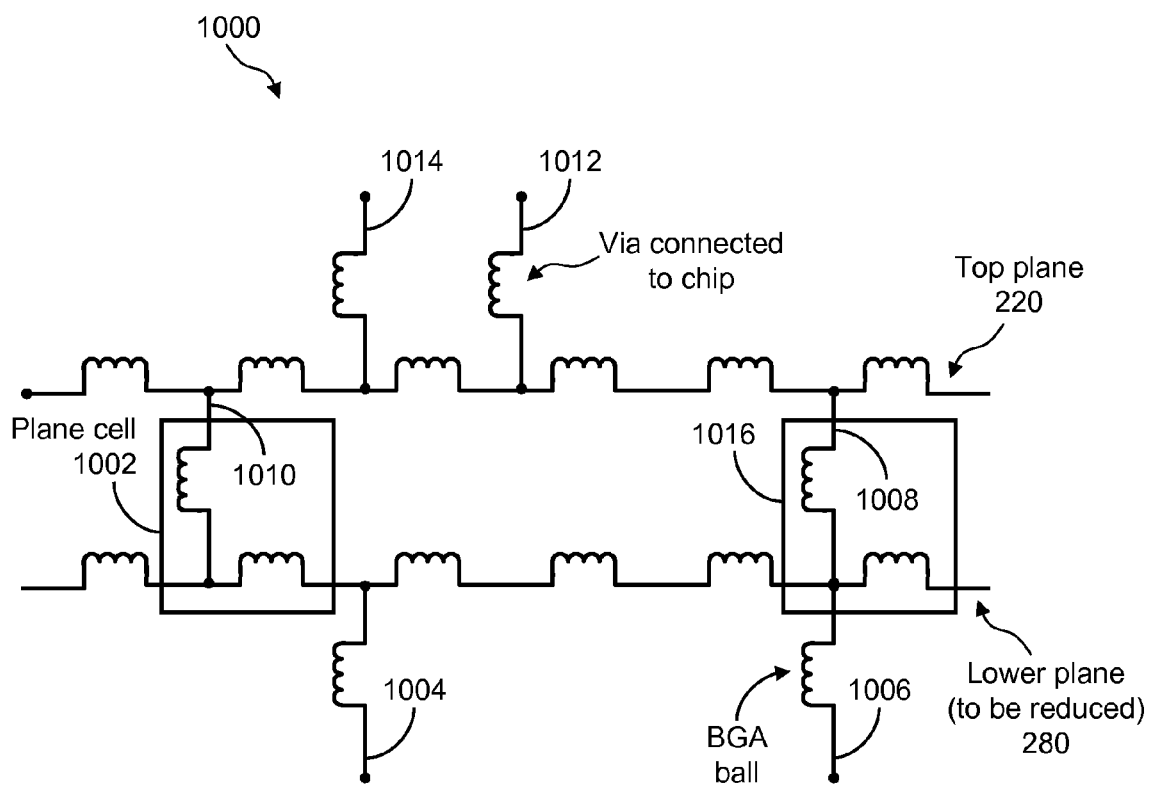
FIG. 10 is an electrical diagram illustrating a one dimensional view of a portion of one of the electrical networks (e.g., VDD 216) of the electronic package 200 of FIG. 2 according to the teachings of the present invention.

Reference now being made to FIG. 10, an electrical diagram is shown illustrating a one dimensional view of a portion 1000 of one of the electrical networks (e.g., VDD 216) of the electronic package 200 of FIG. 2 according to the teachings of the present invention. The portion 1000 includes the top layer 220 and the bottom layer 280 of the electronic package 200 of FIG. 2.

Referring again to FIG. 9, the method continues by selecting one of the vias that are coupled to the bottom of the current selected layer (e.g., 280) (Step 904). In the present example, via 1004 is selected. The reduction proceeds by searching the cell on the layer above the selected via (in this example 1002) to see if another via extending from the upper layer (in this example 220) is coupled to the cell (Step 906).

If an extending via from the upper layer is not found, then the process continues by expanding the cell until an extending via is found. (Steps 908-910).

Once an extending via has been found, then the lateral connections from the bottom via to the extending top via are saved (Step 912).

In the present example, cell 1002 is selected and via 1010 extends from layer 220 to the current selected layer 280. Consequently, the lateral path from via 1004 to via 1010 is saved.

The reduction continues by proceeding back to the next via coupled to the bottom of the selected layer and follows the above process until all the vias coupled to the bottom have been processed (Steps 914-916).

In the present example, via 1006 was selected, cell 1016 was selected, and via 1008 extends from layer 220 to the current selected layer 280. Consequently, the lateral path from via 1006 to via 1008 is saved. All vias coupled to the bottom of the current selected layer 280 have been processed, so the reduction proceeds to end.

Figure 11:
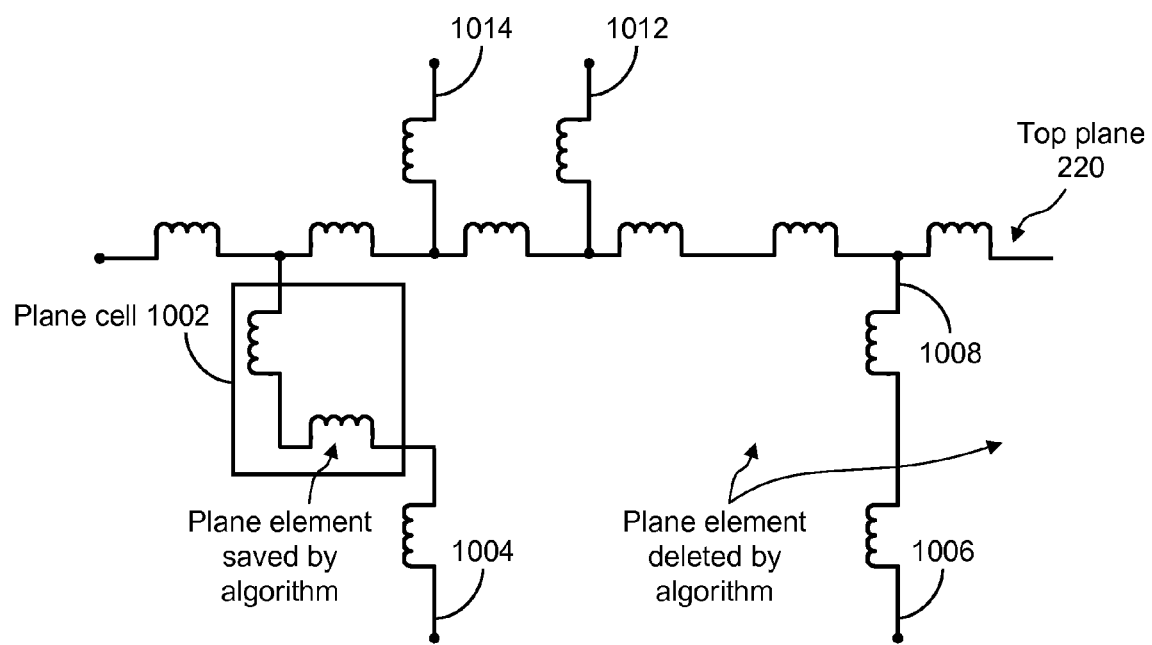
FIG. 11 is an electrical diagram illustrating a reduced model of the portion of the electrical network of FIG. 10 according to the teachings of the present invention.

The saved lateral connections for the reduced model of the electrical network are illustrated in FIG. 11.

Figure 12:
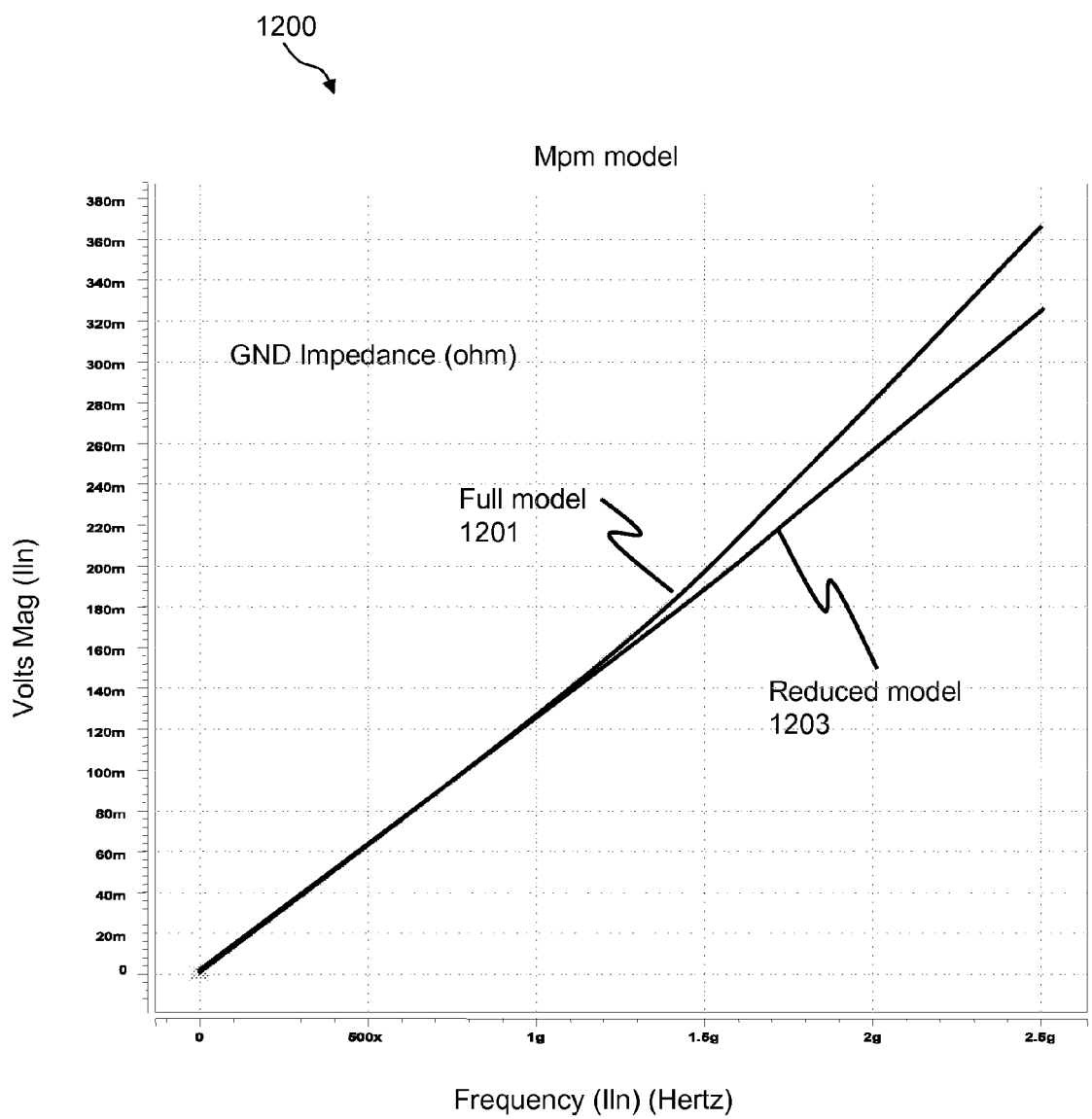
FIG. 12 is a plot diagram illustrating a full model and reduced model impedance plot for a ground power network according to the teachings of the present invention.

Referring again to FIG. 3, the reduced electronic package model from above is examined with simulation software such as Spice and swept through the frequency domain. If the response of the reduced electronic package model in the frequency range of interest is similar to that of the non-reduced model, then the reduced model can be used for power supply simulation. For example, the simulation software could produce the plot diagram 1200 illustrated in FIG. 12 for a ground power network (e.g., GND). The x-axis represents frequency and the y-axis represents impedance. As shown, the model representing the integrated circuit package having reduced lateral grid connections (Reduced Model 1203) has a plot that is comparable to the non-reduced model (Full Model 1201).

If further reduction is desired then the process is repeated; otherwise the process ends (Step 312).

It is thus believed that the operation and construction of the present invention will be apparent from the foregoing description. While the method and system shown and described has been characterized as being preferred, it will be readily apparent that various changes and/or modifications could be made without departing from the spirit and scope of the present invention as defined in the following claims.

What is claimed is:

1. A method of creating a model representing an electrical network residing in an integrated circuit package having multiple layers, the method comprising the steps of:

creating both vertical and horizontal representations of plane cells comprising one or more plane elements of the electrical network for each layer of the integrated circuit package, the vertical representations each being coupled to another vertical or horizontal representation;

determining a frequency response of one or more plane elements of the plane cells as represented by the vertical and horizontal representations of the integrated circuit package;

selecting a greatest frequency from the frequency response;

selecting one of the layers;

removing one or more of the plane elements of the plane cells on the selected layer that are not coupled to one or more of the horizontal representations; and verifying that the remaining vertical and horizontal representations provide the same frequency response as the selected greatest frequency.

2. The method of claim 1 wherein the vertical and horizontal representations are in the form of an inductor in series with a resistor.

3. The method of claim 2 wherein the step of removing includes the step of: dividing the selected layer into one or more cells each having a horizontal representation extending to the next layer.

4. The method of claim 1 wherein the selected layer is the bottom layer of the integrated circuit package.

5. The method of claim 4 wherein the selected layer is any layer other than the top layer of the integrated circuit package.

6. An apparatus for creating a model representing an electrical network residing in an integrated circuit package having multiple layers, the apparatus comprising:
- means for creating both vertical and horizontal representations of plane cells comprising one or more plane elements of the electrical network for each layer of the integrated circuit package, the vertical representations each being coupled to another vertical or horizontal representation;
- means for determining a frequency response of one or more the plane elements of plane cells as represented by the vertical and horizontal representations of the integrated circuit package;
- means for selecting a greatest frequency from the frequency response;
- means for selecting one of the layers;
- means for removing one or more of the plane elements of the plane cells on the selected layer that are not coupled to one or more of the horizontal representations; and
- means for verifying that the remaining vertical and horizontal representations provide the same frequency response as the selected greatest frequency.

7. The apparatus of claim 6 wherein the vertical and horizontal representations are in the form of an inductor in series with a resistor.

8. The apparatus of claim 7 wherein the means for removing includes: means for dividing the selected layer into one or more cells each having a horizontal representation extending to the next layer.

9. The apparatus of claim 8 wherein the selected layer is the bottom layer of the integrated circuit package.

10. The apparatus of claim 8 wherein the selected layer is any layer other than the top layer of the integrated circuit package.

11. A computer program product comprising a computer usable medium having computer usable program code for creating a model representing an electrical network residing in an integrated circuit package having multiple layers, the computer usable program code comprising:
- computer usable program code for creating both vertical and horizontal representations of plane cells comprising one or more plane elements of the electrical network for each layer of the integrated circuit package, the vertical representations each being coupled to another vertical or horizontal representation;
- computer usable program code for determining a frequency response of one or more plane elements of the plane cells as represented by the vertical and horizontal representations of the integrated circuit package;
- computer usable program code for selecting a greatest frequency from the frequency response;
- computer usable program code for selecting one of the layers;
- computer usable program code for removing one or more of the plane elements of the plane cells on the selected layer that are not coupled to one or more of the horizontal representations; and
- computer usable program code for verifying that the remaining vertical and horizontal representations provide the same frequency response up to the selected greatest frequency.

12. The computer program product of claim 11 wherein the vertical and horizontal representations are in the form of an inductor in series with a resistor.

13. The computer program product of claim 12 wherein the computer usable program code for removing includes:
- computer usable program code for dividing the selected layer into one or more cells each having a horizontal representation extending to the next layer.

14. The computer program product of claim 11 wherein the selected layer is the bottom layer of the integrated circuit package.

* * * * *